United States Patent
Hoang et al.

(10) Patent No.: US 7,495,517 B1
(45) Date of Patent: Feb. 24, 2009

(54) TECHNIQUES FOR DYNAMICALLY ADJUSTING THE FREQUENCY RANGE OF PHASE-LOCKED LOOPS

(75) Inventors: Tim Tri Hoang, San Jose, CA (US); Sergey Shumarayev, San Leandro, CA (US)

(73) Assignee: Altera Corporation, San Jose, CA (US)

(*) Notice: Subject to any disclaimer, the term of this patent is extended or adjusted under 35 U.S.C. 154(b) by 106 days.

(21) Appl. No.: 11/610,892

(22) Filed: Dec. 14, 2006

(51) Int. Cl.
*H03L 7/06* (2006.01)
*H03L 7/093* (2006.01)
*H03L 7/095* (2006.01)
*H03L 7/099* (2006.01)
*H03L 7/18* (2006.01)

(52) U.S. Cl. .............. 331/16; 331/17; 331/18; 331/25; 331/DIG. 2

(58) Field of Classification Search ............... 331/1 A, 331/8, 15–18, 25, DIG. 2; 327/156–159; 329/325; 332/127; 360/51; 375/376; 455/260
See application file for complete search history.

(56) References Cited

U.S. PATENT DOCUMENTS

| | | | | |
|---|---|---|---|---|
| 3,164,777 A | * | 1/1965 | Guanella | 327/40 |
| 4,290,029 A | * | 9/1981 | Streckenbach | 331/1 A |
| 4,516,083 A | * | 5/1985 | Turney | 331/1 A |
| 6,411,144 B1 | * | 6/2002 | Matsuno | 327/157 |
| 6,643,499 B1 | | 11/2003 | Audinot et al. | |
| 7,109,764 B2 | * | 9/2006 | Sakamoto et al. | 327/156 |
| 7,138,838 B2 | | 11/2006 | Shibahara et al. | |
| 2004/0164811 A1 | | 8/2004 | Kawasumi et al. | |
| 2005/0099235 A1 | * | 5/2005 | Sakamoto et al. | 331/16 |
| 2005/0110537 A1 | | 5/2005 | Wurzer | |
| 2005/0200390 A1 | | 9/2005 | Starr et al. | |
| 2006/0164174 A1 | | 7/2006 | Molina et al. | |

* cited by examiner

*Primary Examiner*—David Mis
(74) *Attorney, Agent, or Firm*—Steven J. Cahill

(57) ABSTRACT

Techniques are provided for dynamically adjusting the frequency range of phase-locked loops (PLLs). Phase detection circuitry in a PLL generates a control signal in response to a periodic input signal and a feedback signal. When the control signal deviates outside a valid range, the input frequency range of the PLL is dynamically adjusted to include the periodic input signal frequency. The input frequency range of the PLL is adjusted by changing one or more frequency ratios in the PLL. The resistance and/or capacitance of a loop filter in the PLL can be dynamically adjusted to control the bandwidth of the PLL.

22 Claims, 6 Drawing Sheets

TECHNIQUES FOR DYNAMICALLY ADJUSTING THE FREQUENCY RANGE OF PHASE-LOCKED LOOPS

BACKGROUND OF THE INVENTION

The present invention relates to electronic circuits, and more particularly, to phase-locked loop circuits.

A phase-locked loop (PLL) is an electronic circuit with an oscillator. A PLL adjusts the frequency of a feedback signal from the output of the oscillator to match in phase the frequency of an input reference clock signal. Phase-locked loops (PLLs) are an essential building block of many integrated circuits, providing periodic signals for data recovery, data transfer, and other clocking functions. PLLs often supply a clock signal to one or more counters or dividers that divide a signal from the oscillator to a lower frequency clock signal for distribution around an integrated circuit or system.

A PLL can be used to stabilize a particular communications channel (i.e., keeping it set to a particular frequency). A PLL can also be used to generate a signal, modulate or demodulate a signal, reconstitute a signal with less noise, or multiply or divide a frequency. PLLs are frequently used in wireless communication, particularly where signals are carried using frequency modulation (FM) or phase modulation (PM). PLLs can also be used in amplitude modulation (AM). PLLs are commonly used for digital data transmission.

The output signal of a voltage controlled oscillator (VCO) in a PLL typically has a valid operating frequency range. If the frequency of the VCO output signal moves outside the valid operating range, the performance of the VCO can degrade substantially. For example, a substantial amount of jitter may be introduced into the VCO output signal. Also, the VCO may stop oscillating or run very fast. Depending on the design margin of other circuitry in the PLL, certain circuit blocks may not be able to keep up with an increased output frequency of the VCO, causing a functional failure in the PLL.

In most applications, designers provide a stable, unchanging input clock signal frequency that stays within an operating range of a PLL. However, some applications allow the frequency of the input clock signal to vary as much as 300%. Therefore, it would be desirable to provide PLLs that can function in response to a wider range of input signal frequencies, while maintaining acceptable phase noise, jitter, and stability performance.

BRIEF SUMMARY OF THE INVENTION

The present invention provides techniques for dynamically adjusting the frequency range of phase-locked loops (PLLs). Phase detection circuitry in a PLL generates a control signal in response to a periodic input signal and a feedback signal. When the control signal deviates outside a valid range, the input frequency range of the PLL is dynamically adjusted to include the periodic input signal frequency. The input frequency range of the PLL is adjusted by changing one or more frequency ratios in the PLL. According to another embodiment of the present invention, the resistance and/or capacitance of a loop filter in the PLL can be dynamically adjusted to control the bandwidth of the PLL.

Other objects, features, and advantages of the present invention will become apparent upon consideration of the following detailed description and the accompanying drawings.

DETAILED DESCRIPTION OF THE INVENTION

Figure 1:
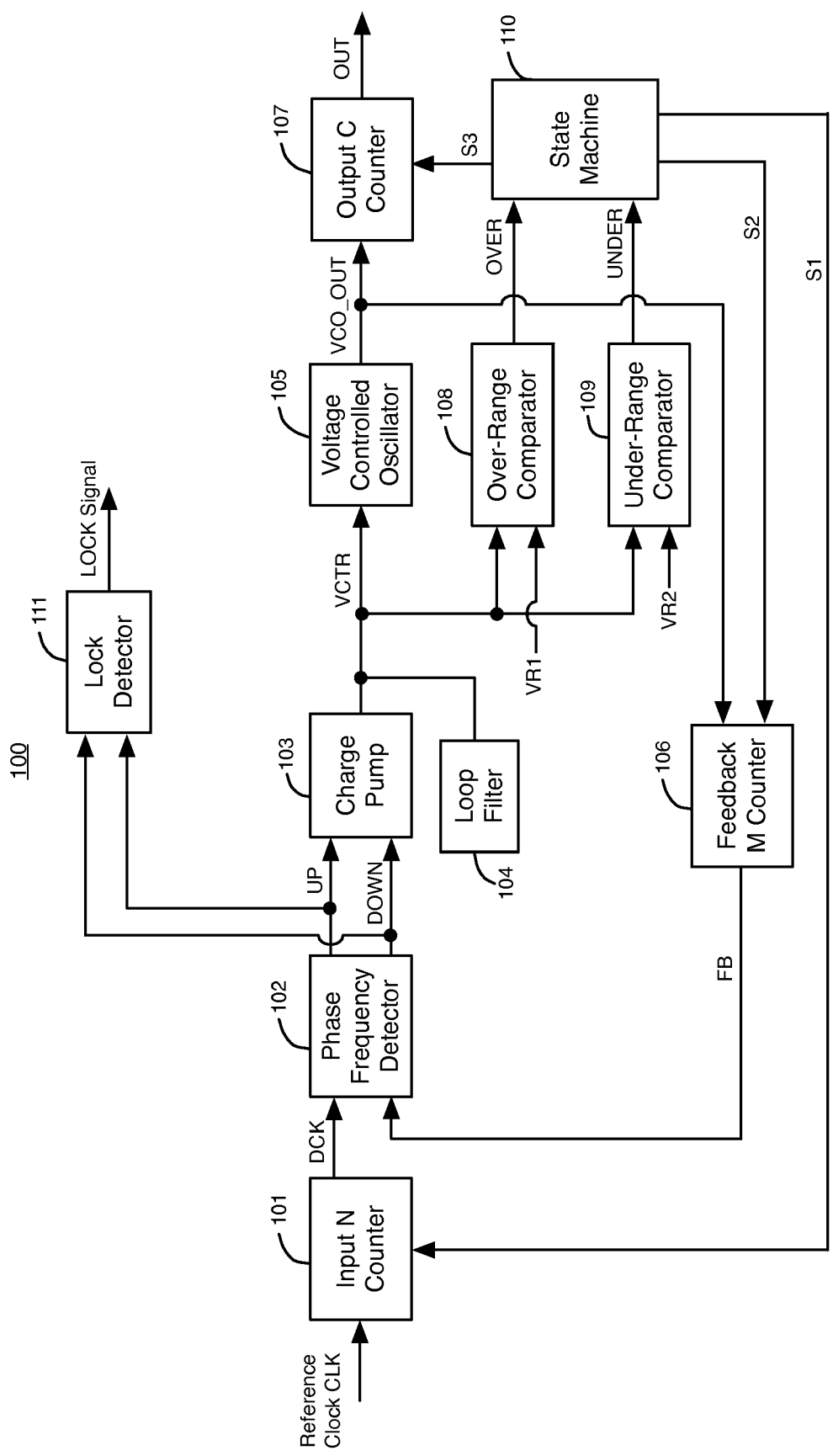
FIG. 1 illustrates a phase-locked loop (PLL) according to a first embodiment of the present invention.

FIG. 1 illustrates a phase-locked loop (PLL) 100, according to a first embodiment of the present invention. PLL 100 includes input N counter 101, phase and frequency detector (PFD) 102, charge pump 103, loop filter 104, voltage controlled oscillator (VCO) 105, feedback M counter 106, output C counter 107, over-range comparator 108, under-range comparator 109, state machine 110, and lock detector 111.

Input N counter circuit 101 receives an input reference clock signal CLK at its input terminal. Counter 101 adjusts the frequency of clock signal CLK by a frequency ratio N to generate a periodic input signal DCK. For example, counter 101 can multiply or divide the frequency of the clock signal to generate DCK. The periodic input signal DCK is transmitted to a first input of phase and frequency detector (PFD) 102. A feedback signal FB is transmitted from the output of feedback counter 106 to a second input of PFD 102.

Phase and frequency detector 102 and charge pump 103 comprise phase detection circuitry that generates a control signal indicative of differences in the phase and frequency of signals DCK and FB. Specifically, phase and frequency detector 102 generates two output signals, UP and DOWN, that are transmitted to inputs of charge pump 103 and lock detect 111. Charge pump 103 generates a voltage control signal VCTR. Loop filter 104 filters voltage VCTR. The voltage of VCTR is indicative of any difference in the phase and frequency of signals DCK and FB.

Voltage VCTR controls the frequency of the output signal VCO_OUT of voltage controlled oscillator (VCO) 105. VCO 105 typically includes multiple delay circuits that are coupled together in a ring oscillator configuration or other oscillator configuration. Voltage VCTR controls the delay of the delay circuits. According to further embodiments of the present invention, VCO 105 can be replaced with a current controlled oscillator, and control signal VCTR can be a current control signal. According to another embodiment of the present invention, VCO 105 can be replaced with a digitally controlled oscillator.

PLL 100 has a feedback loop that includes feedback M counter 106. Feedback M counter 106 adjusts (e.g., divides or multiplies) the frequency of VCO_OUT by a frequency ratio M to generate feedback signal FB. Output C counter 107 adjusts (e.g., divides or multiplies) the frequency of VCO_OUT by a frequency ratio C to generate an output signal OUT. Counters 101, 106, and 107 can be frequency dividers or frequency multipliers. According to an example implementation of PLL 100, counters 101, 106 and 107 are synchronous counters with reset, preset, and load options. However, counters 101, 106, and 107 can be other types of counter circuits according to additional embodiments of the present invention.

If the frequency of FB is less than DCK, detector 102 sends an UP pulse to charge pump 103. In response to the UP pulse, charge pump 103 increases voltage VCTR, causing the frequency of the VCO output signal VCO_OUT to increase. If the frequency of FB is greater than DCK, detector 102 sends a DOWN pulse to charge pump 103. In response to the DOWN pulse, charge pump 103 decreases voltage VCTR, causing the frequency of the VCO output signal VCO_OUT to decrease.

When the frequencies of DCK and FB are matched, voltage VCTR is at a stable voltage. Lock detect circuit 111 monitors the UP and DOWN signals to determine if the frequency of the feedback signal FB is locked with the frequency of signal DCK. When the frequencies of these two signals are locked, lock detect circuit 111 generates a LOCK signal. Typically, pulses in the UP and DOWN signals are very small when the PLL is in lock.

The frequency $F_{VCO\_OUT}$ of the output signal of VCO 105 is a function of the frequency $F_{IN}$ of the reference clock signal CLK and the frequency ratios N and M of counters 101 and 106, respectively, as shown in equation (1).

$$F_{VCO\_OUT} = \frac{F_{IN} \times M}{N} \quad (1)$$

The frequency $F_{OUT}$ of the output signal OUT of output counter 107 is a function of the frequency $F_{IN}$ of the reference clock signal CLK and the frequency ratios N, M, and C of counters 101, 106, and 107, respectively, as shown by equation (2).

$$F_{OUT} = \frac{F_{IN} \times M}{N \times C} \quad (2)$$

For example, if the frequency $F_{IN}$ of the reference clock signal CLK=100 MHz, C=4, N=2, and M=30, then $F_{OUT}$=375 MHz, and the ratio of $F_{OUT}/F_{IN}$=3.75. Examples of frequency ranges for reference clock signal CLK are 25-135 MHz and 15-135 MHz. The example values and ranges provided herein are not intended to limit the scope of the present invention.

Figure 2:
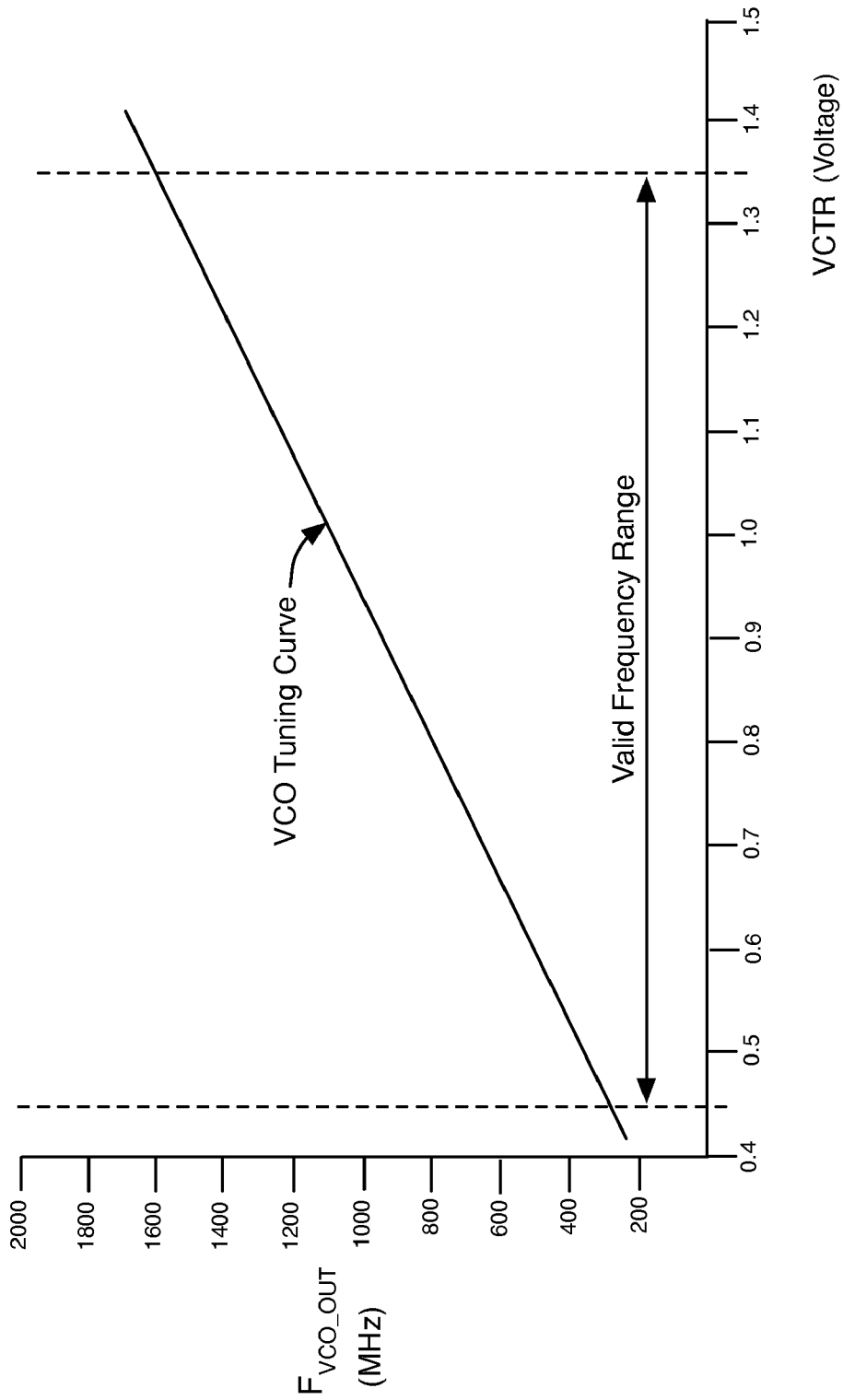
FIG. 2 illustrates an example of a voltage controlled oscillator tuning curve for the phase-locked loop of FIG. 1.

FIG. 2 illustrates an example of a VCO tuning curve for PLL 100. FIG. 2 illustrates the relationship between the frequency $F_{VCO\_OUT}$ of VCO output signal VCO_OUT and control voltage VCTR. Voltage controlled oscillator 105 operates properly within a particular valid frequency range. If the frequency of the output signal VCO_OUT deviates outside the valid frequency range, the performance of VCO 105 can degrade substantially.

In the example of FIG. 2, VCO 105 operates within a valid frequency range of 300 MHz to 1600 MHz for particular values of frequency ratios C, N and M. The valid frequency range corresponds to a valid control voltage VCTR range, e.g., from 0.45 volts to 1.35 volts in the example of FIG. 2. PLL 100 maintains acceptable performance characteristics as long as control voltage VCTR remains within the valid control voltage range.

According to an embodiment of the present invention, comparators 108 and 109 in PLL 100 monitor control voltage VCTR to determine when VCTR varies outside the valid control voltage range. When clock signal CLK has a frequency that causes voltage VCTR to vary outside the valid control voltage range, state machine 110 dynamically adjusts one or more of the frequency ratios N and M of counters 101 and 106 using signals S1 and S2 to cause the frequency of VCO_OUT to remain within the valid frequency range of VCO 105. By adjusting the frequency ratios N and/or M, PLL 100 is able to dynamically adjust the operating frequency range for reference clock signal CLK that causes VCO 105 to generate frequencies for VCO_OUT within its valid frequency range. As a result, PLL 100 can continue to maintain its performance characteristics (e.g., jitter characteristics) after discrete changes in the input frequency of reference clock CLK. PLL 100 is especially useful for applications in which the input frequency range is unknown.

State machine 110 can also maintain a selected, constant ratio M/(N*C) between the output and reference clock frequencies ($F_{OUT}/F_{IN}$) by dynamically adjusting one or more of frequency ratios N, M and/or C of counters 101, 106, and 107 using signals S1, S2, and S3, respectively. For example, if a ratio of 2 is set for M/(N*C), and state machine 110 changes the value of M, then state machine 110 can change the value of C and/or N to maintain a constant ratio of 2. State machine 110 can adjust the frequency ratio C of counter 107 to maintain a selected ratio between $F_{OUT}$ and $F_{IN}$, after frequency ratios N and/or M are changed to adjust the dynamic frequency range of PLL 100. Each of signals S1, S2, and S3 can be a set of serial or parallel signals.

Each of the counter circuits 101, 106, and 107 has an adjustable frequency ratio, N, M, and C, respectively. A counter circuit that provides an adjustable frequency divider ratio can be, for example, by a preset divide-by-N counter circuit. A preset divide-by-N counter circuit typically includes several flip-flops coupled together. The flip-flops are clocked by an input clock signal. For example, flip-flops in counter 106 are clocked by the VCO_OUT input signal. Signals representing the binary value of a desired frequency division ratio are loaded into the counter during a preset operation. The counter then counts downs from the frequency division ratio binary value to zero. The binary value of the output signals of the flip-flops is decreased by one in each period of the input clock signal. When the counter finishes counting down, the counter generates an edge on its output clock signal. The counter then begins to count down again.

The frequency division ratio of the counter can be changed by loading signals having a different binary value into the counter. For example, if the frequency of the input clock signal is to be divided by 4, a binary value of 2 is loaded to the count high value (for clock high time) and a binary of 2 also is loaded to the count low value (for clock low time). The counter starts to count down from the highest counter value. Once the counter value reaches all zeros, the counter switches from the high count (clock high time) to the low count (clock low time).

Alternatively, counter circuits 101, 106, and 107 can be implemented by preset divide-by-N counters that count up from zero to a preset binary value. In this embodiment, the counter also has a set of flip-flops that are coupled together and that are clocked by an input clock signal. The output signals of the flip-flops are initially set to zero. Signals that represents a frequency division ratio are loaded into the counter during a preset operation. The binary value of the flip-flop output signals are increased by one in each period of the input clock signal. When the binary value of the flip-flop output signals reaches the frequency division ratio, the counter generates an edge on its output clock signal. The counter then resets the output signals of the flip-flops to zero, and begins to count up again. The frequency division ratio of the count-up counter can be changed by loading signals that have a different binary value into the counter.

Over-range comparator 108 compares control voltage VCTR with a first reference voltage VR1 that is indicative of a first voltage threshold level. Reference voltage VR1 is a voltage that is selected to represent the upper threshold of the valid control voltage range of VCO 105. Reference voltage VR1 can be selected prior to PLL operation to compensate for process variations that make PLL 100 operate fast, normal, or slow. When the control voltage VCTR exceeds VCTR, comparator 108 generates an OVER signal at its output. The OVER is provided to an input of state machine 110.

Under-range comparator 109 compares control voltage VCTR with a second reference voltage VR2 that is indicative of a second voltage threshold level. Reference voltage VR2 represents the lower threshold of the valid control voltage range of VCO 105. Reference voltage VR2 can also be selected prior to PLL operation to compensate for process variations that make PLL 100 operate fast, normal, or slow. When the control voltage VCTR drops below VR2, comparator 109 generates an UNDER signal at its output. The UNDER signal is provided to an input of state machine 110.

Figure 3:
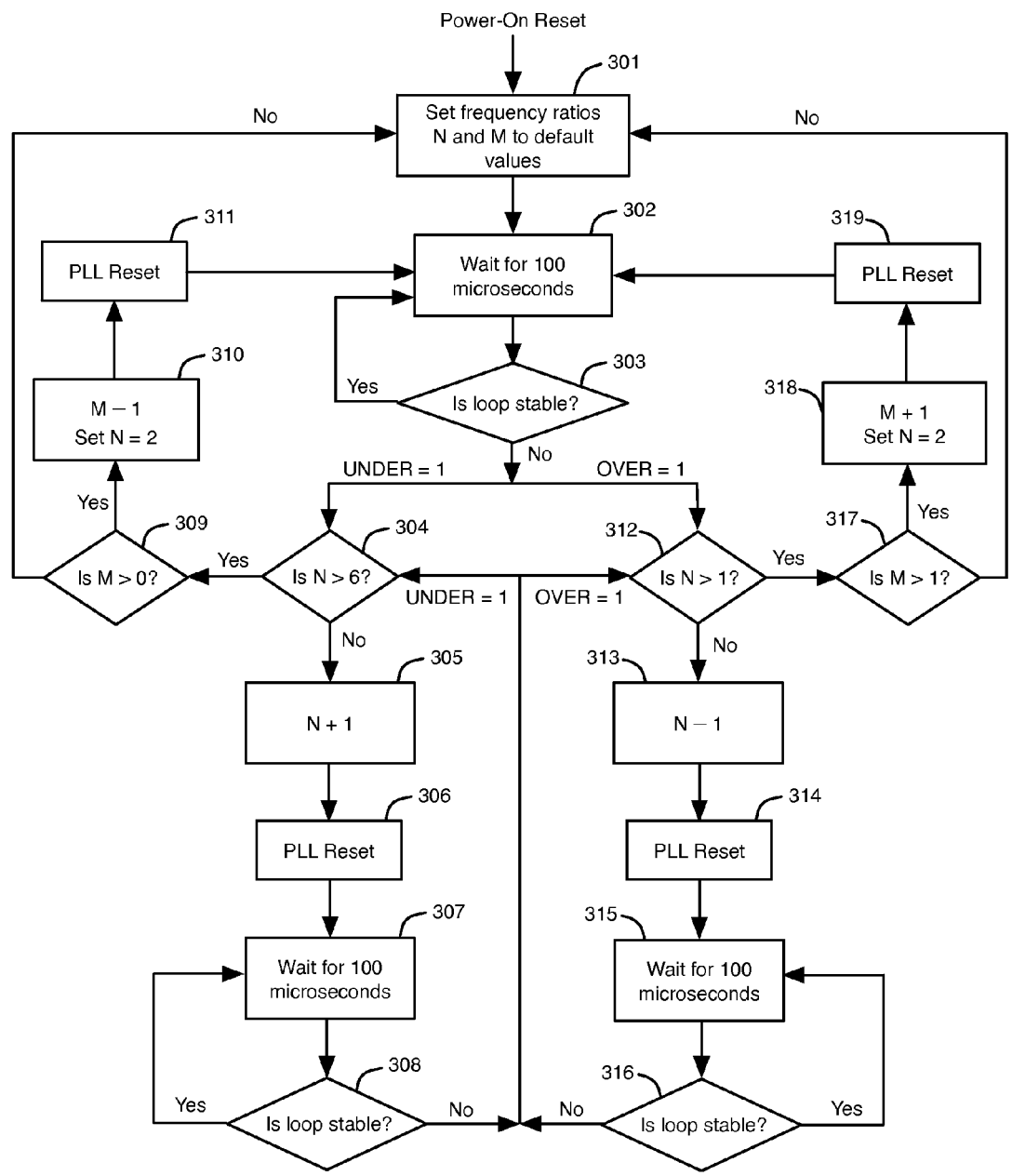
FIG. 3 is a flow chart that illustrates an example of a process that can be performed by a state machine for adjusting one or more frequency ratios of a PLL, according to an embodiment of the present invention.

Further details of the operation of an embodiment of state machine 110 are shown in FIG. 3. FIG. 3 is a flow chart that illustrates an example of a process that can be performed by state machine 110 for setting the frequency ratios M and N, according to an embodiment of the present invention. State machine 110 can, for example, be implemented in soft IP in a field programmable gate array (FPGA), e.g., by configuring programmable logic blocks.

After a power-on reset, state machine 110 sets the frequency ratios N and M of counters 101 and 106, respectively, to default values, at step 301. The default values for N and M can correspond to the optimum or the most-used setting. As an example, state machine 110 can set N=2 and M=1 at step 301. The values provided for N, M, and C herein are examples that are not intended to limit the scope of the present invention.

At step 302, state machine 110 waits for a predetermined period of time. The predetermined period of time is set based on the longest period of time that it typically takes PLL 100 to lock onto an input clock signal. The predetermined period of time in step 302 can, for example, be set to 100 microseconds (μs) as shown in FIG. 3. According to one embodiment, state machine 110 can set a delay counter to time the duration of the wait at step 302.

Then, at conditional step 303, state machine 110 checks the values of the LOCK signal, the UNDER signal, and the OVER signal to determine if the feedback loop in PLL 100 is stable. The feedback loop is stable when the LOCK signal is asserted. If the feedback loop is stable, state machine 110 returns to step 302. The state machine 110 continues to loop through steps 302 and 303 until the LOCK signal is not asserted, and either of the UNDER or OVER signals are asserted.

If the UNDER signal is asserted (e.g., UNDER=1), then state machine 110 proceeds to conditional step 304. At conditional step 304, the state machine determines whether frequency ratio N is greater than 6. If N is less than or equal to 6, state machine 110 adds 1 to frequency ratio N at step 305.

At step 306, PLL 100 is placed into reset. Usually, PLL 100 loses lock after changing one of the counter frequency ratios N or M. Therefore, it is recommended that PLL 100 be reset any time that a counter frequency ratio is changed. PLL 100 can be automatically reset by state machine 110. During a reset sequence, the output voltage VCTR of loop filter 104 is set to 0, then to half of its maximum value. The outputs of all of the counters 101/106/107, PFD 102, and VCO 105 are disabled. The output voltage VCTR of loop filter 104 is then set to 0.7 volts. Next, the output of VCO 105 is enabled. Subsequently, the output voltage VCTR of loop filter 104 is released. Then, PFD 102 and the counters 101/106/107 are enabled. PLL 100 will then try to lock signal FB to signal DCK. Automatic resets are also recommended at steps 311, 314, and 319, which are described below.

After step 306, state machine 110 waits for a predetermined period of time, e.g., 100 microseconds at step 307. At conditional step 308, state machine 110 checks the values of the LOCK signal, the UNDER signal, and the OVER signal to determine if the feedback loop in PLL 100 is stable. If the feedback loop is stable, state machine 110 returns to step 307 and continues to loop through steps 307 and 308 until the UNDER signal or the OVER signal is asserted. If the UNDER signal is asserted (UNDER=1), state machine 110 returns to step 304.

When the OVER signal is asserted (e.g., OVER=1), state machine 110 exits step 303 or 308 and moves to step 312. At conditional step 312, state machine 110 determines if frequency ratio N is greater than 1. If N is not greater than 1, state machine 110 subtracts 1 from N at step 313. At step 314, the PLL is placed into reset. State machine 110 then waits for a period of time (e.g., 100 microseconds) at step 315.

At conditional step 316, state machine 110 checks the values of the LOCK signal, the UNDER signal, and the OVER signal to determine if the feedback loop in PLL 100 is stable. If the feedback loop is stable, state machine 110 returns to step 315 and continues to loop through steps 315 and 316 until the UNDER signal or the OVER signal is asserted. State machine 110 returns to step 312 when OVER=1 and to step 304 when UNDER=1.

When N is greater than 6 at step 304, state machine 110 proceeds to conditional step 309. At step 309, state machine 110 determines if frequency ratio M is greater than 0. If M>0 at step 309, state machine 110 sets N equal to 2, and subtracts 1 from M at step 310. PLL 100 is then reset at step 311. Subsequently, state machine 110 returns to step 302 and waits for 100 microseconds. The reset pulse at step 311 can, for example, last about 10 nanoseconds. If M is not greater than 0 at step 309, state machine 110 returns to step 301 to reset frequency ratios N and M to their default values.

When N is greater than 1 at step 312, state machine 110 proceeds to conditional step 317. At step 317, state machine 110 determines if frequency ratio M is greater than 1. If M is greater than 1 at step 317, state machine 110 sets N equal to 2, and adds 1 to M at step 318. PLL 100 is then reset at step 319. Subsequently, state machine 110 returns to step 302 and waits for 100 microseconds. If M is not greater than 1 at step 317, state machine 110 returns to step 301 to reset frequency ratios N and M to their default values.

Each time that state machine 110 changes the value of frequency ratio M of counter 106, state machine 110 changes frequency ratio C or frequency ratio N by an amount that maintains a selected, constant ratio between the output frequency $F_{OUT}$ and the reference clock frequency $F_{IN}$. Thus, as the value of M is varied to keep PLL 100 within the operating frequency range, the value of C and/or N are varied so that the ratio of $F_{OUT}/F_{IN}=M/(N*C)$ remains constant.

Table 1 below illustrates examples of 7 possible configuration settings for PLL 100. State machine 110 can put PLL 100 into any of the configuration settings shown in Table 1. The values of frequency ratios M and C are different in each of the 7 configuration settings. Table 1 has 3 columns that correspond to three different frequency ratios, 1×, ½×, and 3.5×, for $F_{OUT}/F_{IN}$. For each of the three different frequency ratios (1×, ½×, and 3.5×) in Table 1, state machine 110 adjusts the values of M and C each time that PLL 100 moves into a new configuration setting to maintain the same ratio between M and C. Configuration setting 2 is the default setting for the example configurations shown in Table 1 based on an average input frequency of 60-80 MHz.

TABLE 1

| Configuration | N | M | R | C (N) = 1× | C (N + 1) = ½× | C (N + 2) = 3.5× |
|---|---|---|---|---|---|---|
| 1 | 1 | 7 | 2 | 7 | 14 | 2 |
| 2 (default) | 1 | 14 | 4 | 14 | 28 | 4 |
| 3 | 1 | 21 | 4 | 21 | 42 | 6 |
| 4 | 1 | 28 | 4 | 28 | 56 | 8 |
| 5 | 1 | 35 | 4 | 35 | 70 | 10 |
| 6 | 1 | 42 | 4 | 42 | 84 | 12 |
| 7 | 1 | 49 | 4 | 49 | 98 | 14 |

In Table 1, the frequency ratio N of counter 101 is 1 for each of the 7 example configuration settings. However, state machine 110 can also vary the frequency ratio N to provide additional configuration settings for PLL 100. For example, N can be set to 2, 3, or 4. According to the example provided in Table 1, there is one value of M and 3 different values of C for each value of N and each configuration setting. Thus, if there are 7 configuration settings and 3 possible values for N, there are 21 possible values for M and 63 possible values for C, using the example values in Table 1.

The values for N, M, and C and the frequency ratios for $F_{OUT}/F_{IN}$ shown in Table 1 are merely examples that are provided to illustrate principles of the present invention. Phase-locked loops of the present invention can generate any desired frequency and frequency ratio for $F_{OUT}/F_{IN}$ using other values for N, M, and C.

Loop filter 104 in PLL 100 has a network of resistors. In Table 1, R stands for the net resistance of the resistor network in loop filter 104. State machine 110 changes the resistance R of loop filter 104 when moving between some of the configuration settings to effect the stability and the bandwidth of phase-locked loop 100. In the example shown in Table 1, R is changed from 2 to 4 when PLL 100 moves from configuration setting 1 to configuration setting 2.

The bandwidth BW of PLL 100 is proportional to the resistance R in loop filter 104, the current $I_{CP}$ generated by charge pump 103, the gain $K_{VCO}$ of VCO 105, and the inverse of the frequency ratio M of counter 106, as shown in equation (3) below.

$$BW \propto \frac{K_{VCO} \times I_{CP} \times R}{M} \quad (3)$$

State machine 110 can vary the resistance R of loop filter 104 to vary the bandwidth of PLL 100 or to maintain a particular bandwidth after frequency ratio M is changed. State machine 110 can also change the current $I_{CP}$ generated by charge pump 103 to effect the bandwidth of PLL 100 in addition to, or instead of, changing resistance R. An example of a default current $I_{CP}$ for charge pump 103 that provides an intermediate bandwidth is 20 milliamps (mA).

Figure 4:
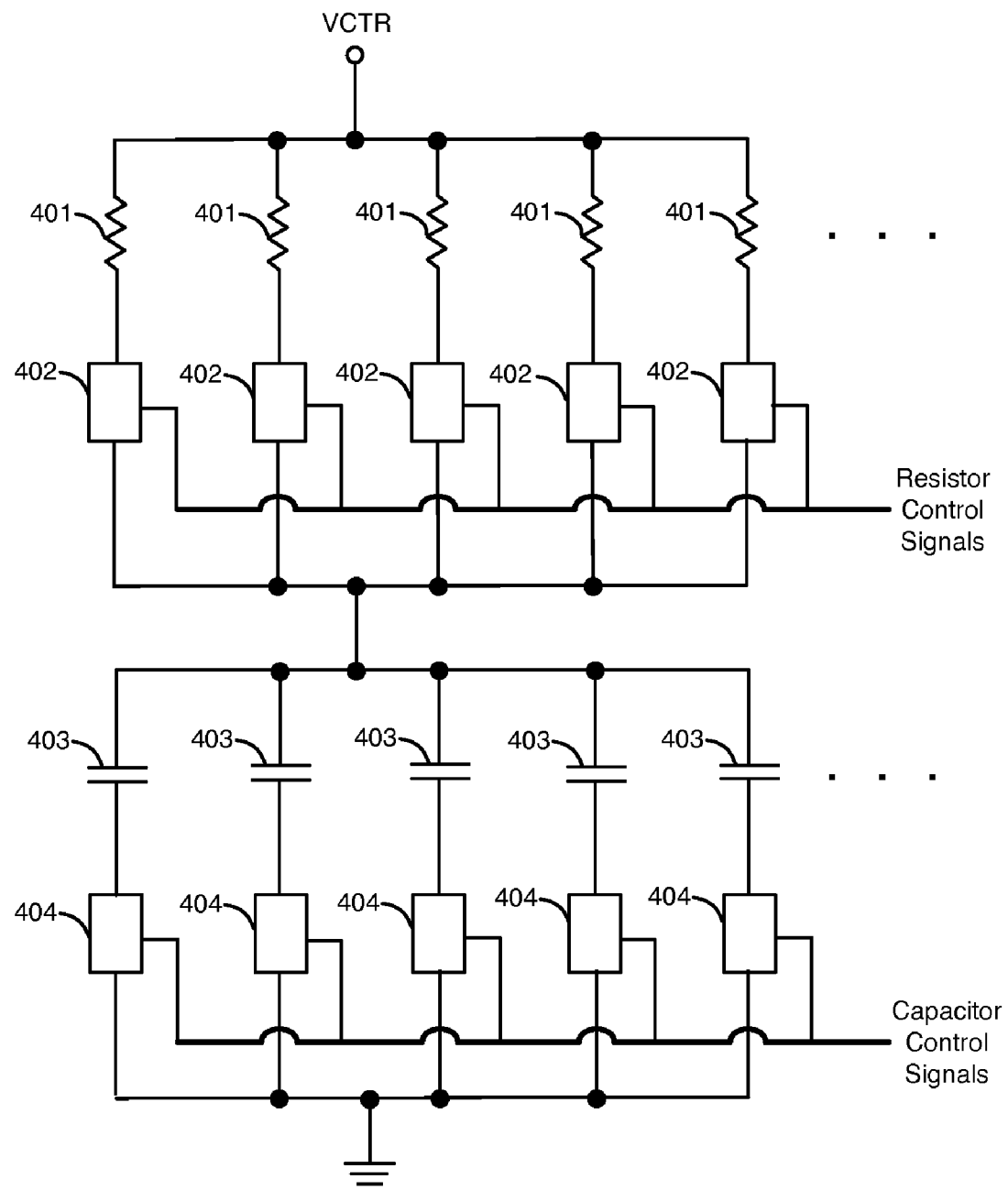
FIG. 4 illustrates a schematic of a loop filter having a variable resistance and a variable capacitance, according to an embodiment of the present invention.

FIG. 4 illustrates an example of a loop filter with a variable resistance and a variable capacitance that can be adjusted by state machine 110, according to another embodiment of the present invention. The loop filter of FIG. 4 is an example of loop filter 104 shown in FIG. 1. The resistance R of the loop filter of FIG. 4 is implemented by a network of resistors 401 that are coupled together in parallel by pass gates 402. Pass gates 402 are selectively turned on or off by a set of resistor control signals to effect the net resistance of the resistor network. The resistor control signals are generated by state machine 110. State machine 110 can vary the resistance of the resistor network in loop filter 104 by changing the conductive states of one or more of pass gates 402.

According to another embodiment of the present invention, state machine 110 can vary the capacitance of loop filter 104 to vary the bandwidth of PLL 100 or to maintain a particular bandwidth after frequency ratio M has been changed. State machine 110 can also adjust the capacitance of loop filter 104 to maintain the stability of PLL 100 after one or more of the frequency ratios of the counter circuits 101 and 106 has been changed.

In the embodiment of FIG. 4, the capacitance of loop filter 104 is implemented by a network of capacitors 403 that are coupled together in parallel by pass gates 404. Pass gates 404 are selectively turned on or off by a set of capacitor control signals to effect the net capacitance of the capacitor network. The capacitor control signals are generated by state machine 110. State machine 110 can vary the capacitance of the capacitor network by changing the conductive states of one or more of pass gates 404.

In addition to the variables shown in Table 1, state machine 110 can change the reference voltages VR1 and VR2 provided to comparators 108 and 109 to vary the range of output frequencies generated by VCO 105. As mentioned above, the reference voltages VR1 and VR2 can each have multiple (e.g., 3) different values that correspond to fast, slow, and normal process variations. The reference voltages can be generated by resistor divider circuits. Multiplexers select reference voltages from the resistor divider circuits in response to control signals and transmit the selected reference voltages to comparators 108 and 109.

Figure 5:
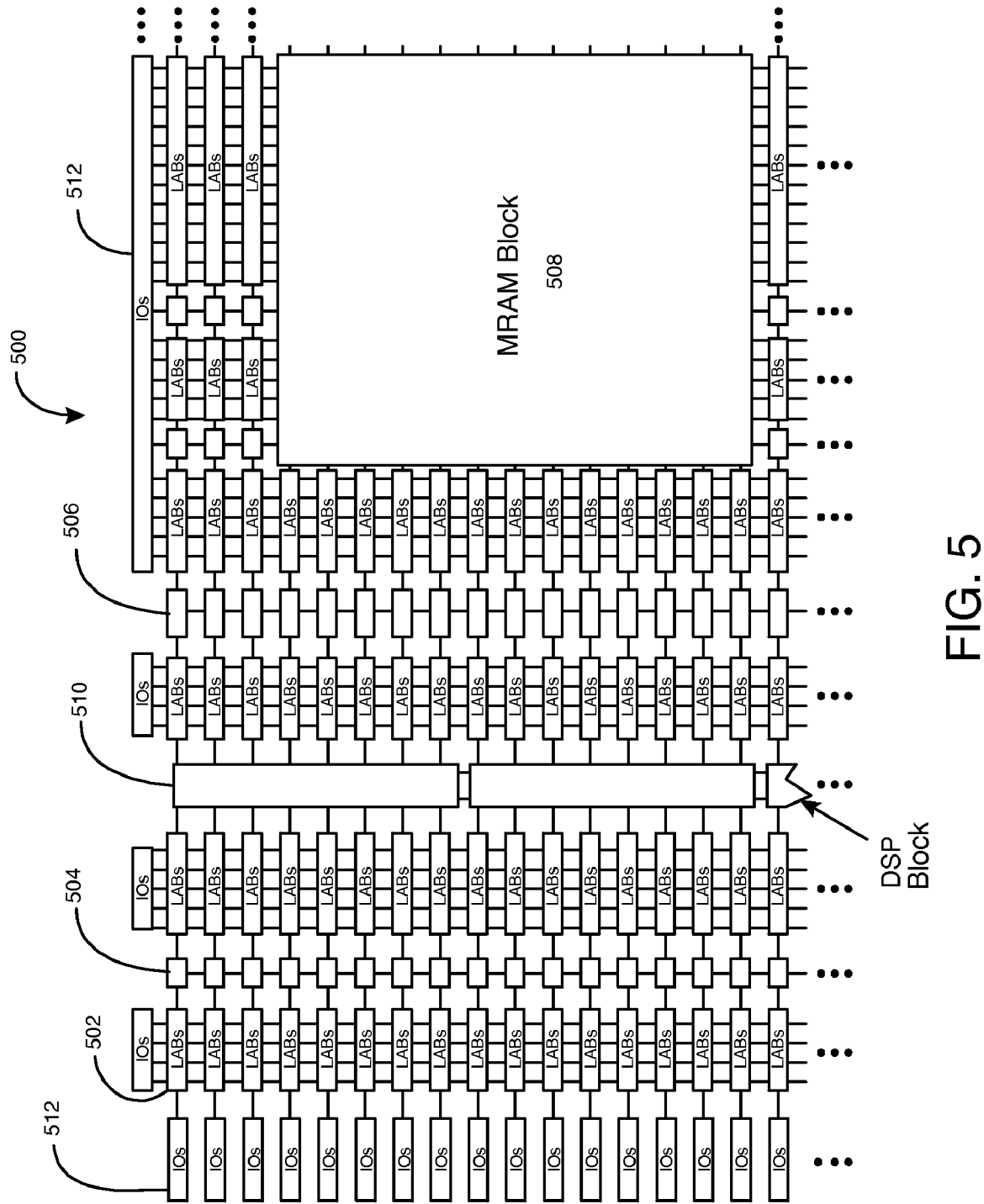
FIG. 5 is a simplified partial block diagram of a field programmable gate array (FPGA) that can include aspects of the present invention.

FIG. 5 is a simplified partial block diagram of an FPGA 500 that can include aspects of the present invention. FPGA 500 is merely one example of an integrated circuit that can include features of the present invention. It should be understood that PLLs of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 500 includes a two-dimensional array of programmable logic array blocks (or LABs) 502 that are interconnected by a network of column and row interconnect conductors of varying length and speed. LABs 502 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including RAM blocks of varying sizes provided throughout the array. The RAM blocks include, for example, blocks 504, blocks 506, and block 508. These memory blocks can also include shift registers and FIFO buffers.

FPGA 500 further includes digital signal processing (DSP) blocks 510 that can implement, for example, multipliers with add or subtract features. IO blocks (IOs) 512 located, in this example, around the periphery of the chip support numerous single-ended and differential input/output standards. The IO blocks 512 contain IO buffers and are typically grouped into IO banks. It is to be understood that FPGA 500 is described herein for illustrative purposes only and that the present invention can be implemented in many different types of PLDs, FPGAs, and the like.

Figure 6:
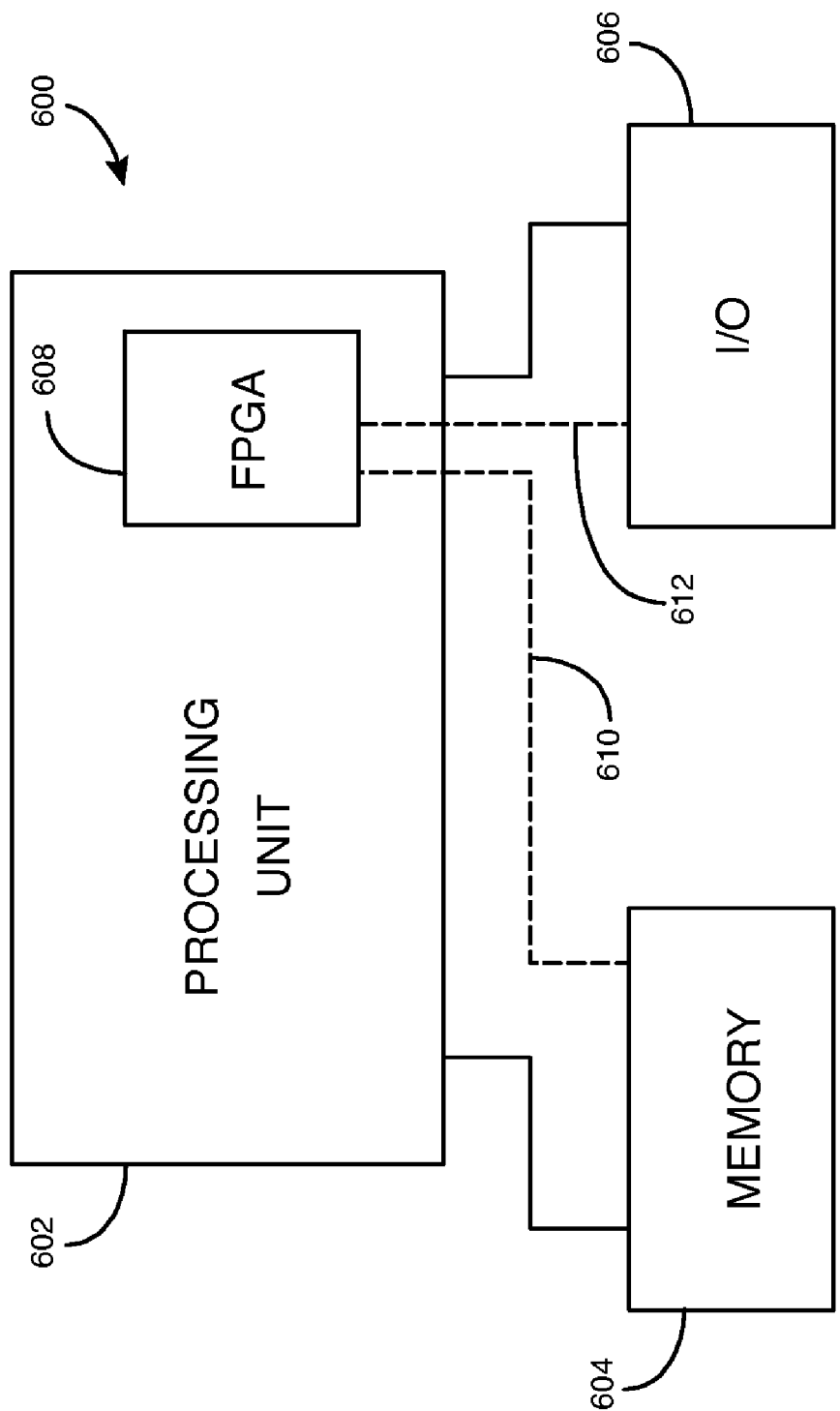
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, an FPGA 608 is embedded in processing unit 602. FPGA 608 can serve many different purposes within the system in FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor, which can be reprogrammed as needed to handle a particular computing task. Alternately, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A phase-locked loop comprising:
   phase detection circuitry that generates a control signal in response to a periodic input signal and a feedback signal;
   an oscillator that generates a periodic output signal having a frequency controlled by the control signal;
   a first frequency adjustment circuit that adjusts a frequency of the feedback signal according to a first frequency ratio in response to the periodic output signal; and
   a control circuit configured to adjust the first frequency ratio between at least three different ratios to maintain the control signal within a control range corresponding to a valid frequency range of the oscillator.

2. The phase-locked loop defined in claim 1 wherein the control circuit is configured to adjust the first frequency ratio between at least four different ratios to maintain the control signal within the control range.

3. The phase-locked loop defined in claim 1 wherein the control circuit is configured to adjust the first frequency ratio between at least five different ratios to maintain the control signal within the control range.

4. The phase-locked loop defined in claim 1 further comprising:
   comparison circuitry that determines if the control signal is within the control range; and
   a second frequency adjustment circuit that adjusts a frequency of the periodic input signal according to a second frequency ratio in response to an input reference clock signal,
   wherein the control circuit is configured to adjust the second frequency ratio between at least three different ratios to maintain the control signal within the control range.

5. The phase-locked loop defined in claim 4 further comprising:
   a third frequency adjustment circuit that adjusts a frequency of a frequency divided output clock signal according to a third frequency ratio in response to the periodic output signal of the oscillator, wherein the control circuit is configured to adjust the third frequency ratio between at least three different ratios.

6. The phase-locked loop defined in claim 1 wherein the control circuit is a state machine that is implemented by programmable logic blocks in a programmable logic integrated circuit.

7. A phase-locked loop comprising:
   phase detection circuitry that generates a control signal in response to a periodic input signal and a feedback signal;
   an oscillator that generates a periodic output signal having a frequency controlled by the control signal;
   a first frequency adjustment circuit that adjusts a frequency of the periodic input signal according to a first frequency ratio in response to an input reference clock signal; and
   a control circuit configured to adjust the first frequency ratio between at least three different ratios to maintain the control signal within a control range corresponding to a valid frequency range of the oscillator.

8. The phase-locked loop defined in claim 7 further comprising:
   comparison circuitry that determines if the control signal is within the control range; and a second frequency adjustment circuit that adjusts a frequency of the feedback signal according to a second frequency ratio in response to the periodic output signal of the oscillator, wherein the control circuit is configured to adjust the second frequency ratio between at least three different ratios to maintain the control signal within the control range.

9. The phase-locked loop defined in claim 8 further comprising:

a third frequency adjustment circuit that adjusts a frequency of a frequency divided output clock signal according to a third frequency ratio in response to the periodic output signal of the oscillator, wherein the control circuit maintains a constant ratio between a frequency of the frequency divided output clock signal and a frequency of the input reference clock signal by adjusting at least one of the first, the second, and the third frequency ratios in response to a change in at least one of the first and the second frequency ratios.

10. The phase-locked loop defined in claim 7 wherein the phase detection circuitry comprises a phase frequency detector and a charge pump that is coupled to the phase frequency detector and that generates the control signal.

11. The phase-locked loop defined in claim 7 wherein the control circuit is a state machine that is implemented by programmable logic blocks in a programmable logic integrated circuit.

12. A method for adjusting a frequency range of a phase-locked loop, the method comprising:

comparing frequencies of a periodic input signal and a feedback signal to generate a control signal;

controlling a frequency of a periodic output signal generated by an oscillator in response to the control signal;

adjusting a frequency of a signal in the phase-locked loop according to a frequency ratio;

comparing the control signal to a reference signal to generate a comparison signal; and adjusting the frequency ratio between at least three different ratios in response to the comparison signal to maintain the frequency of the periodic output signal within a valid frequency range of the oscillator.

13. The method defined in claim 12 wherein adjusting the frequency of the signal in the phase-locked loop according to the frequency ratio further comprises adjusting the frequency of the feedback signal in response to the periodic output signal.

14. The method defined in claim 12 wherein adjusting the frequency of the signal in the phase-locked loop according to the frequency ratio further comprises adjusting the frequency of the periodic input signal in response to an input reference clock signal.

15. A phase-locked loop comprising:

phase detection circuitry that generates a control signal in response to a periodic input signal and a feedback signal;

an oscillator that generates a periodic output signal having a frequency controlled by the control signal;

a first frequency adjustment circuit that adjusts a frequency of the periodic input signal according to a first frequency ratio in response to an input reference clock signal;

a second frequency adjustment circuit that adjusts a frequency of a frequency divided output clock signal according to a second frequency ratio in response to the periodic output signal; and a control circuit that maintains a constant ratio between a frequency of the frequency divided output clock signal and a frequency of the input reference clock signal by adjusting the second frequency ratio after the control circuit adjusts the first frequency ratio.

16. The phase-locked loop defined in claim 15 further comprising:

a third frequency adjustment circuit that adjusts a frequency of the feedback signal according to a third frequency ratio in response to the periodic output signal, wherein the control circuit maintains the constant ratio between the frequency of the frequency divided output clock signal and the frequency of the input reference clock signal by adjusting the second frequency ratio after the control circuit adjusts the third frequency ratio.

17. The phase-locked loop defined in claim 16 further comprising:

comparison circuitry that determines if the control signal is within a control range corresponding to a valid frequency range of the oscillator, wherein the control circuit is configured to adjust the first frequency ratio between at least three different ratios to maintain the control signal within the control range.

18. The phase-locked loop defined in claim 17 wherein the control circuit is configured to adjust the third frequency ratio between at least three different ratios to maintain the control signal within the control range.

19. A phase-locked loop comprising:

phase detection circuitry that generates a control signal in response to a periodic input signal and a feedback signal;

a loop filter that filters the control signal and that comprises at least three capacitors and at least three pass gates in a first set;

an oscillator that generates a periodic output signal having a frequency controlled by the control signal; and a control circuit that controls conductive states of the three pass gates in the first set, wherein the control circuit adjusts the conductive states of one or more of the three pass gates in the first set when the control signal reaches a threshold level, and the three capacitors are coupled together in parallel when the three pass gates in the first set are on.

20. The phase-locked loop defined in claim 19 wherein the loop filter comprises at least three resistors and at least three pass gates in a second set, the control circuit controls conductive states of the three pass gates in the second set, the control circuit adjusts the conductive states of one or more of the three pass gates in the second set when the control signal reaches the threshold level, and the three resistors are coupled together in parallel when the three pass gates in the second set are on.

21. A phase-locked loop comprising:

phase detection circuitry that generates a control signal in response to a periodic input signal and a feedback signal;

a loop filter that filters the control signal and that comprises at least three resistors and at least three pass gates;

an oscillator that generates a periodic output signal having a frequency controlled by the control signal; and a control circuit that controls conductive states of the three pass gates, wherein the control circuit adjusts the conductive states of one or more of the three pass gates when the control signal reaches a first reference signal, and the three resistors are coupled together in parallel when the three pass gates are on.

22. The phase-locked loop defined in claim 21 further comprising:

a first comparator that compares the control signal to the first reference signal, wherein the control circuit adjusts the conductive states of one or more of the three pass gates in response to an output signal of the first com parator when the control signal reaches the first reference signal; and a second comparator that compares the control signal to a second reference signal, wherein the control circuit adjusts the conductive states of one or more of the three pass gates in response to an output signal of the second comparator when the control signal reaches the second reference signal.

* * * * *